US009871057B2

(12) United States Patent
Nummy et al.

(10) Patent No.: US 9,871,057 B2
(45) Date of Patent: Jan. 16, 2018

(54) FIELD-EFFECT TRANSISTORS WITH A NON-RELAXED STRAINED CHANNEL

(71) Applicant: GLOBALFOUNDRIES INC., Grand Cayman (KY)

(72) Inventors: Karen A. Nummy, Hopewell Junction, NY (US); Claude Ortolland, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/060,067

(22) Filed: Mar. 3, 2016

(65) Prior Publication Data

US 2017/0256565 A1 Sep. 7, 2017

(51) Int. Cl.

| | |
|---|---|
| ***H01L 27/01*** | (2006.01) |
| ***H01L 27/12*** | (2006.01) |
| ***H01L 31/0392*** | (2006.01) |
| ***H01L 29/06*** | (2006.01) |
| ***H01L 29/161*** | (2006.01) |
| ***H01L 27/092*** | (2006.01) |
| ***H01L 21/84*** | (2006.01) |
| ***H01L 21/8238*** | (2006.01) |
| ***H01L 29/10*** | (2006.01) |

(52) U.S. Cl.

CPC .. *H01L 27/1203* (2013.01); *H01L 21/823807* (2013.01); *H01L 21/823878* (2013.01); *H01L 21/84* (2013.01); *H01L 27/092* (2013.01); *H01L 29/0649* (2013.01); *H01L 29/1054* (2013.01); *H01L 29/161* (2013.01)

(58) Field of Classification Search

CPC ......... H01L 21/823807; H01L 27/1203; H01L 21/84; H01L 29/161; H01L 29/0649; H01L 29/41783; H01L 21/823878

USPC ... 257/347, 369, 19, 616, E29.056, E21.633, 257/E27.112, E21.618, E21.634, E21.564

See application file for complete search history.

(56) References Cited

U.S. PATENT DOCUMENTS

2012/0007145 A1 1/2012 Chen et al.

2015/0270349 A1* 9/2015 Cheng .................. H01L 29/161 257/9

* cited by examiner

*Primary Examiner* — Thien F Tran

(74) *Attorney, Agent, or Firm* — Thompson Hine LLP; Yuanmin Cai

(57) ABSTRACT

Device structures for a field-effect transistor and methods of forming such device structures using a device layer of a silicon-on-insulator substrate. A channel and an isolation region are formed in the device layer. The channel is located beneath a gate structure is formed on the device layer and is comprised of a semiconductor material under strain. A portion of the device layer is located between the first isolation region and the channel. The portion of the device layer is under a strain that is less than the strain in the semiconductor material of the channel.

20 Claims, 3 Drawing Sheets

FIELD-EFFECT TRANSISTORS WITH A NON-RELAXED STRAINED CHANNEL

BACKGROUND

The invention relates generally to integrated circuits and, in particular, to device structures for a field-effect transistor with a strained channel and methods of forming such device structures.

Complementary metal-oxide-semiconductor (CMOS) technology is used in microprocessors, static random access memories, and other types of digital integrated circuits. Generally, CMOS technology relies on complementary and symmetrical pairs of p-type and n-type field-effect transistors (nFETs and pFETS) to implement logic functions. Planar field-effect transistors include an active semiconductor region, a source and a drain defined in the active semiconductor region, and a gate electrode. When a control voltage exceeding a characteristic threshold voltage is applied to the gate electrode, an inversion or depletion layer is formed in a channel defined in the active semiconductor region between the source and drain by the resultant electric field and carrier flow occurs between the source and drain to produce a device output current.

Semiconductor-on-insulator (SOI) substrates may be advantageous in CMOS technology. In comparison with field-effect transistors built using a bulk silicon wafer, a semiconductor-on-insulator substrate permits operation at significantly higher speeds with improved electrical isolation and reduced electrical losses. The performance of field-effect transistors may be improved through the use of thin active semiconductor layers, which permit the field-effect transistors to operate in a fully-depleted state in which the depletion layer extends to the buried oxide layer when typical control voltages are applied to the gate electrode.

In certain technology nodes, different channel materials may be used for n-type field-effect transistor and p-type field-effect transistor devices. For example, the device performance of a p-type field-effect transistor may be enhanced if the channel is composed of a different semiconductor material than silicon. For example, the channel of a p-type field-effect transistor may be composed of silicon germanium (SiGe), which is characterized by a higher hole carrier mobility that is greater than the hole mobility of silicon.

Shallow trench isolation (STI) is a used in semiconductor fabrication for isolating neighboring field-effect transistors. Shallow trench isolation is formed by etching trenches that circumscribe an active semiconductor region and filling the trenches with an electrical insulator, such as silicon dioxide. Under certain circumstances, the shallow trench isolation may unwantedly relax the strain that is present in the SiGe channel of a p-type field-effect transistor.

Improved device structures for a field-effect transistor with a strained channel and methods of forming such device structures are needed.

SUMMARY

In an embodiment of the invention, a method is provided for forming a device structure using a device layer of a silicon-on-insulator substrate. A channel and an isolation region are formed in the device layer. The channel is located beneath a gate structure is formed on the device layer and is comprised of a semiconductor material under strain. A portion of the device layer is located between the first isolation region and the channel. The portion of the device layer is under a strain that is less than the strain in the semiconductor material of the channel.

In an embodiment of the invention, a device structure is formed using a device layer of a silicon-on-insulator substrate. The device structure includes a gate structure on the device layer, a channel in the device layer, and an isolation region in the device layer. The channel is located beneath the gate structure, and the channel comprised of a semiconductor material under strain. A portion of the device layer is located between the first isolation region and the channel. The portion of the device layer is under a strain that is less than the strain in the semiconductor material of the channel.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
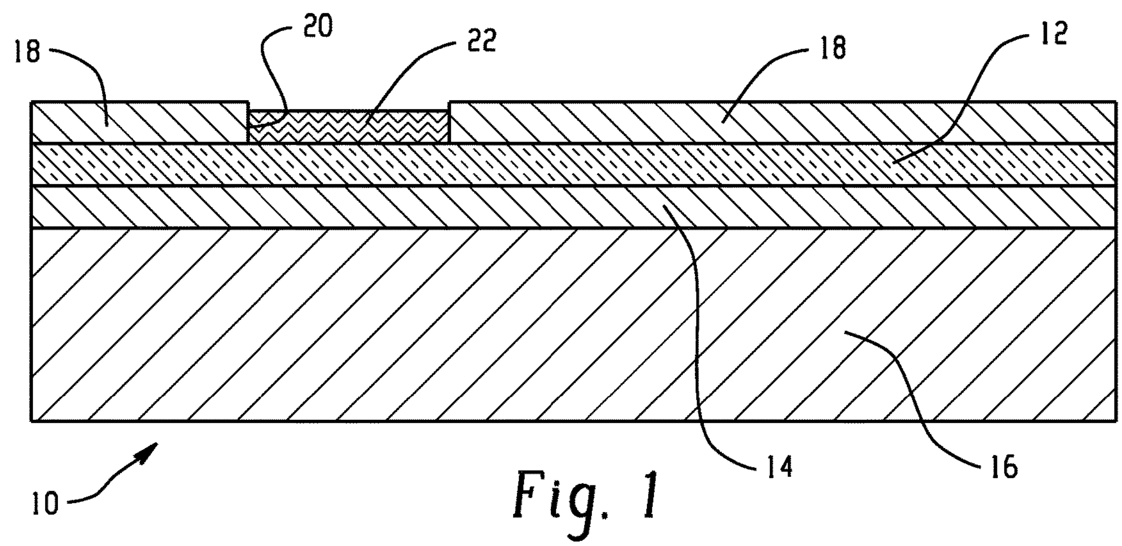
FIGS. 1-5 are cross-sectional views of a portion of a substrate illustrating successive stages of a fabrication process forming a device structure in accordance with an embodiment of the invention.

With reference to FIG. 1 and in accordance with an embodiment of the invention, an semiconductor-on-insulator (SOI) substrate 10 includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. In one embodiment, the device layer 12 may be extremely thin (i.e., a thickness of 2 nm to 15 nm) characteristic of extremely thin semiconductor on insulator (ETSOI) substrate that may be used to manufacture fully-depleted SOI devices (FDSOI). The device layer 12 and the handle wafer 16 may be comprised of a single crystal semiconductor material, such as single crystal silicon. The BOX layer 14 has a surface in direct contact with the handle wafer 16 along an interface and another surface in direct contact with the device layer 12 along an interface, and these surfaces are separated by the thickness of the BOX layer 14 that extends to the rim of the SOI substrate 10. The device layer 12 is electrically isolated from the handle wafer 16 by the BOX layer 14.

A hardmask layer 18 is located on a top surface of the device layer 12. The hardmask layer 18 may be composed of a dielectric material, such as silicon nitride ($Si_3N_4$) deposited by chemical vapor deposition. The dielectric material constituting the hardmask layer 18 is chosen to provide etch selectivity relative to the semiconductor material constituting the device layer 12. The hardmask layer 18 is patterned using a etch mask and an etching process to form an opening 20, which extends through the hardmask layer 18 to the top surface of the device layer 12.

An epitaxial semiconductor layer 22 is formed on a portion of the device layer 12 inside of the opening 20 in the hardmask layer 18 and on the top surface of the device layer

12. In an embodiment, the epitaxial semiconductor layer 22 may contain germanium and, in particular, may be comprised of silicon germanium (SiGe) deposited by chemical vapor deposition (CVD) and having a germanium concentration (i.e., the ratio of the germanium content to the germanium and silicon content) ranging from 2% to 50%. The epitaxial semiconductor layer 22 may be formed using an epitaxial growth process. Epitaxial growth is a process by which the single-crystal semiconductor material of the epitaxial semiconductor layer 22 is deposited on the single-crystal semiconductor material of the device layer 12 and in which the crystal orientation and crystal structure of the single-crystal material of the device layer 12 is reproduced in the semiconductor material of the epitaxial semiconductor layer 22. The epitaxial semiconductor layer 22 may be formed by a selective epitaxial growth process in which the constituent semiconductor material nucleates for epitaxial growth on semiconductor surfaces, but does not nucleate for epitaxial growth from insulator surfaces, such as the top surface of the hardmask layer 18.

Figure 2:
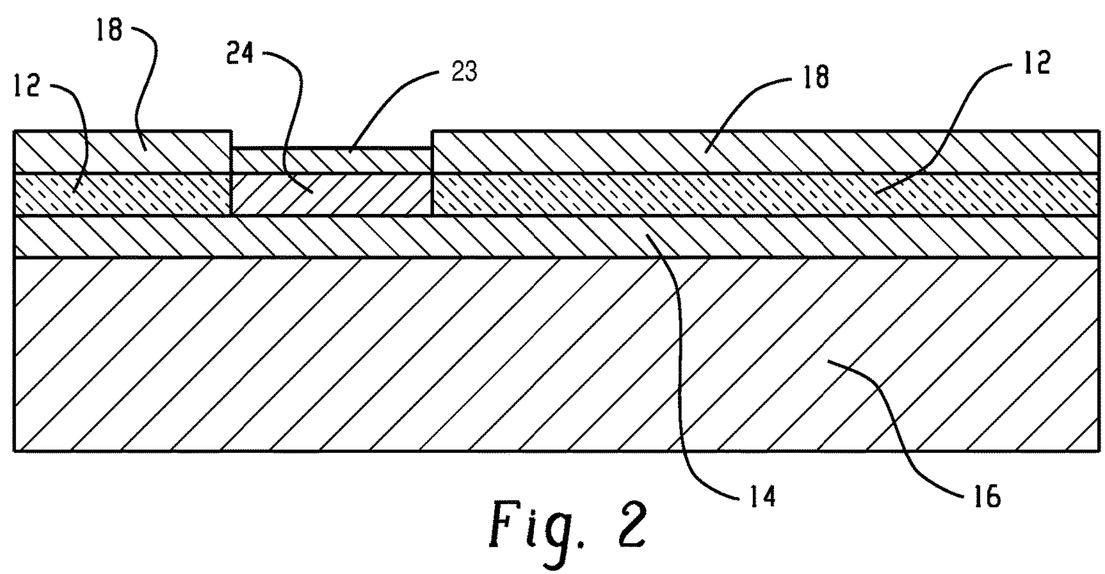

With reference to FIG. 2 in which like reference numerals refer to like features in FIG. 1 and at a subsequent fabrication stage, a thermal process is used to cause germanium atoms to be transported (e.g., diffuse) from the epitaxial semiconductor layer 22 (FIG. 1) into a portion 24 of the device layer 12 nominally coinciding with the area of the opening 20. The processed portion 24 of device layer 12 extends from the top surface of the device layer 12 to the BOX layer 14 and is in direct contact with the BOX layer 14. In other words, the entire thickness of the device layer 12 is locally modified over the section in contact with the epitaxial semiconductor layer 22 by the thermal process to form the processed portion that has a different composition than the surrounding unprocessed sections of the device layer 12. The differential composition imparts strain, which in one embodiment may be compressive strain, into the processed portion 24 of device layer 12.

In an embodiment, the thermal process may comprise thermal condensation that involves a wet thermal oxidation process or a dry thermal oxidation process. During oxidation, germanium atoms are irreversibly transported from the epitaxial semiconductor layer 22 into the device layer 12 as the epitaxial semiconductor layer 22 oxidizes across its thickness beginning at its top surface and advance toward the interface with the portion 24 of the device layer 12. Thermal condensation is based on, among other factors, germanium and silicon each having diamond lattice structures, and the different chemical affinities between germanium and silicon with respect to oxygen.

In an embodiment, the thermal condensation may be performed by a dry oxidation process in an oxidizing ambient containing at least one oxygen-containing gas (e.g., dry oxidation using oxygen as the oxidizing gas at a substrate temperature ranging, for example, from 850° C. to 1250° C.). The thermal process may involve cycles of alternating thermal oxidation and annealing. The hardmask layer 18, which is oxygen impermeable, prevents oxidation of the covered portions of the device layer 12. The end result of thermal condensation is that the epitaxial semiconductor layer 22 is converted to an oxidized remnant 23 depleted of germanium, and the processed portion 24 of the device layer 12 receiving the germanium is converted into a germanium-enriched semiconductor material that retains the single crystal state of the initial semiconductor material from which the device layer 12 is composed. The BOX layer 14 rejects the diffusion of germanium such that the germanium displaced from the epitaxial semiconductor layer 22 is located entirely in the processed portion 24 of device layer 12.

The germanium concentration in the processed portion 24 of device layer 12 depends on, among other factors, the thickness and composition of the device layer 12, and the germanium content and thickness of the epitaxial semiconductor layer 22. In an embodiment, the processed portion 24 of device layer 12 may be initially composed of silicon and converted by the thermal process into silicon germanium with a germanium concentration ranging from 2% to 50%. The thickness of the processed portion 24 of device layer 12 may be increased by the introduction of germanium into its composition. After oxidation, an additional thermal anneal in an non-oxidizing atmosphere (e.g., dry nitrogen) may be used to homogenize the germanium distribution in the processed portion 24 of device layer 12 under conditions resulting in homogenization without causing strain relaxation.

The processed portion 24 of device layer 12 may incorporate compressive strain due to a change to its crystal structure induced by the introduction of germanium. Germanium atoms locate at lattice sites in the crystal structure of the semiconductor material constituting the device layer 12 having the modified composition and have a larger atomic size than, for example, silicon atoms. Generally, silicon germanium has a slightly larger lattice constant than silicon. While in contact with the surrounding unprocessed portion of the device layer 12, the lattice structure of the processed portion 24 is forced to conform to the lattice structure of the surrounding semiconductor material of the device layer 12, which produces the compressive strain that is introduced into the processed portion 24 of device layer 12. Increasing the germanium content of the processed portion 24 will operate to increase the amount of incorporated compressive strain.

Following the thermal process, the oxidized remnant 23 of the epitaxial semiconductor layer 22, which has a composition depleted of germanium by the thermal process, may be selectively removed, such as by etching, for example, using a dilute hydrofluoric acid (HF). Subsequently, the hardmask layer 18 may be removed from the top surface of the device layer 12 using, for example, chemical mechanical polishing (CMP) or chemical etching. The top surface of the device layer 12 is thereby exposed for further processing.

Figure 3:
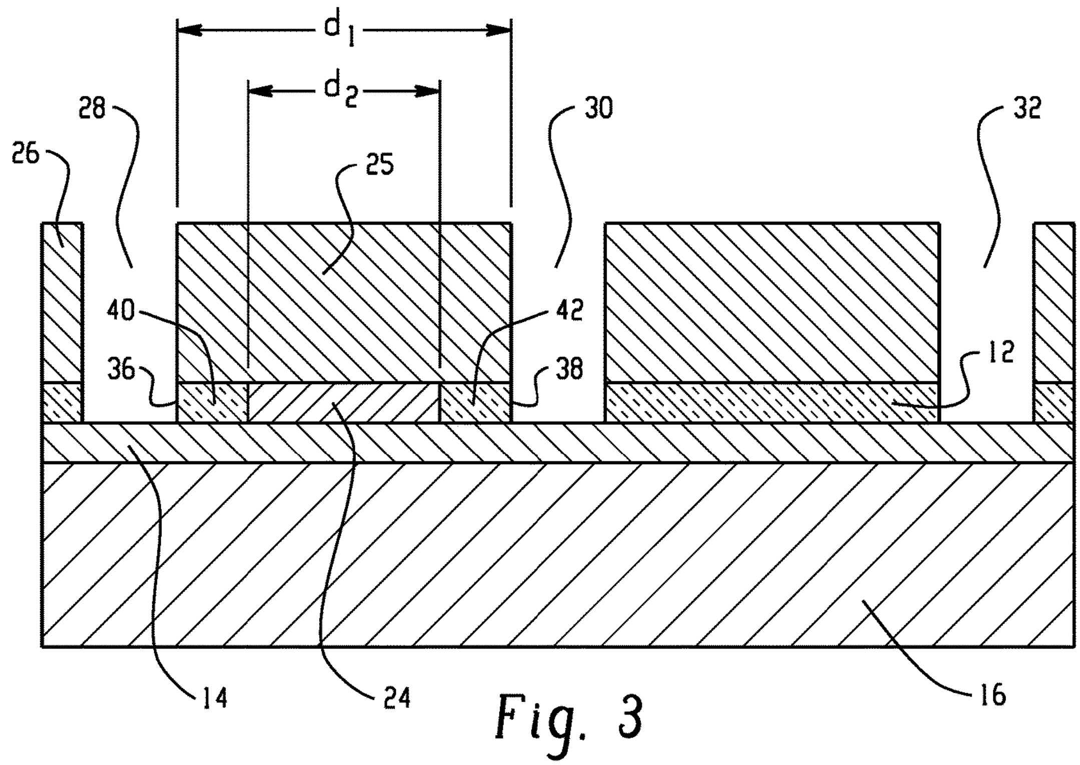

With reference to FIG. 3 in which like reference numerals refer to like features in FIG. 2 and at a subsequent fabrication stage, an etch mask 26 is formed on the top surface of the device layer 12. The etch mask 26 may be comprised of a layer of a light-sensitive material, such as an organic photoresist, that may be applied as a fluid by a spin coating process, pre-baked, exposed to light projected through a photomask, baked after exposure, and developed with a chemical developer. The patterning of the etch mask 26 defines openings that coincide with the subsequent locations of trenches used to form isolation regions and thereby define device regions for different types of field-effect transistors.

Trenches 28, 30, 32 may be formed in the semiconductor material constituting the device layer 12 by a dry etch processes and are located at the respective locations of the openings in the etch mask 26. The trenches 28, 30, 32 reach in depth to the top surface of BOX layer 14. In other words, the trenches 28, 30, 32 extend through the entire thickness of the device layer 12 to the top surface of the BOX layer 14.

A portion 25 of the etch mask 26 has a dimension, d1, that is greater than the length, d2, of the processed portion 24 of device layer 12, and is aligned relative to the processed portion 24 of device layer 12 such that the processed portion 24 of device layer 12 is protected and preserved when the trenches 28, 30, 32 are formed. The dimension, d1, of the portion 25 of the etch mask 26 is greater than the corresponding dimension of the opening 20 in the hardmask layer 18 used earlier to form the processed portion 24 of device layer 12.

A sidewall 36 of trench 28 is aligned with a sidewall of the portion 25 of the etch mask 26. A sidewall 38 of trench 30 is aligned with an opposite sidewall of the portion 25 of the etch mask 26. The trenches 28, 30 are spaced apart such that a portion 40 of the device layer 12 is located between the sidewall 36 of trench 34 and the processed portion 24 of device layer 12, and a portion 42 of the device layer 12 is located between the sidewall 38 of trench 28 and the processed portion 24 of device layer 12. The portions 40, 42 of the device layer 12 are juxtaposed (and coextensive with) with the processed portion 24 of device layer 12. The portions 40, 42 of the device layer 12 function to promote retention of the compressive strain that is incorporated into the processed portion 24 of device layer 12 after the trenches 28, 30, 32 are formed.

Figure 4:
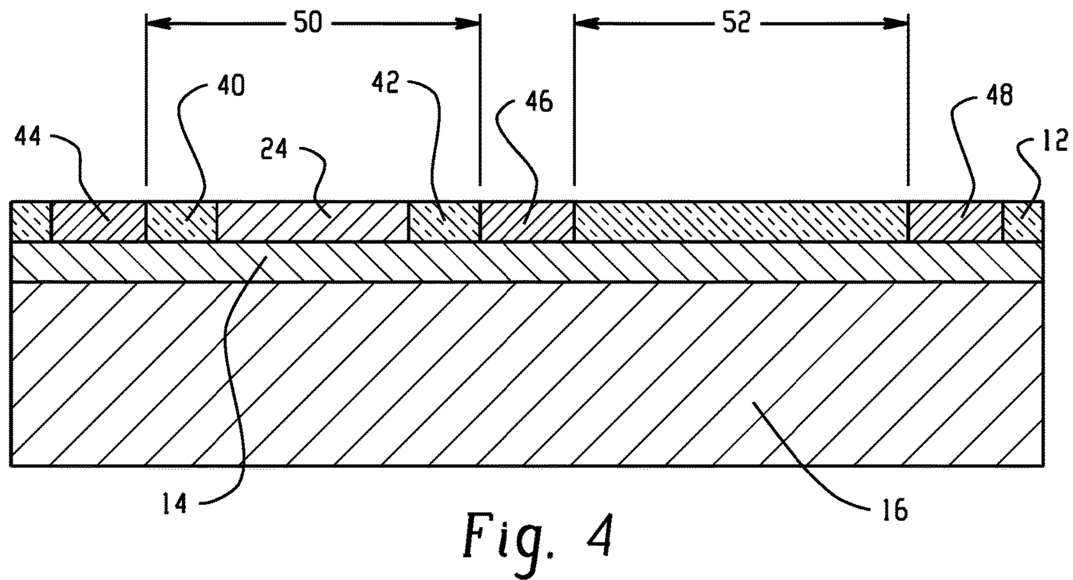

With reference to FIG. 4 in which like reference numerals refer to like features in FIG. 3 and at a subsequent fabrication stage, isolation regions 44, 46, 48 may be formed in trenches 28, 30, 32 by depositing an electrical insulator to fill the trenches, and then planarizing the electrical insulator relative to the top surface of the device layer 12 using, for example, chemical mechanical polishing. The electrical insulator comprising the isolation regions 44, 46, 48 may be an oxide of silicon (e.g., silicon dioxide) deposited by chemical vapor deposition. In an embodiment, the electrical insulator comprising the isolation regions 44, 46, 48 may be a high-aspect-ratio process (HARP) oxide film deposited by sub-atmospheric chemical vapor deposition utilizing ozone and tetraethylorthosilicate (TEOS) as reactant gases.

A device region 50 is defined between isolation region 44 and isolation region 46, and includes the portions 40, 42 of the device layer 12 and the processed portion 24 of device layer 12. The portions 40, 42 of the device layer 12 are respectively juxtaposed with (and coextensive with) the isolation regions 44, 46, are juxtaposed with (and coextensive with) the processed portion 24 of device layer 12, and may be unstrained. The device region 50 may be used to construct a p-type field-effect transistor.

A device region 52 is defined by a portion of the device layer 12 that is located between isolation region 46 and isolation region 48. The device region 52 may be used to construct an n-type field-effect transistor.

Figure 5:
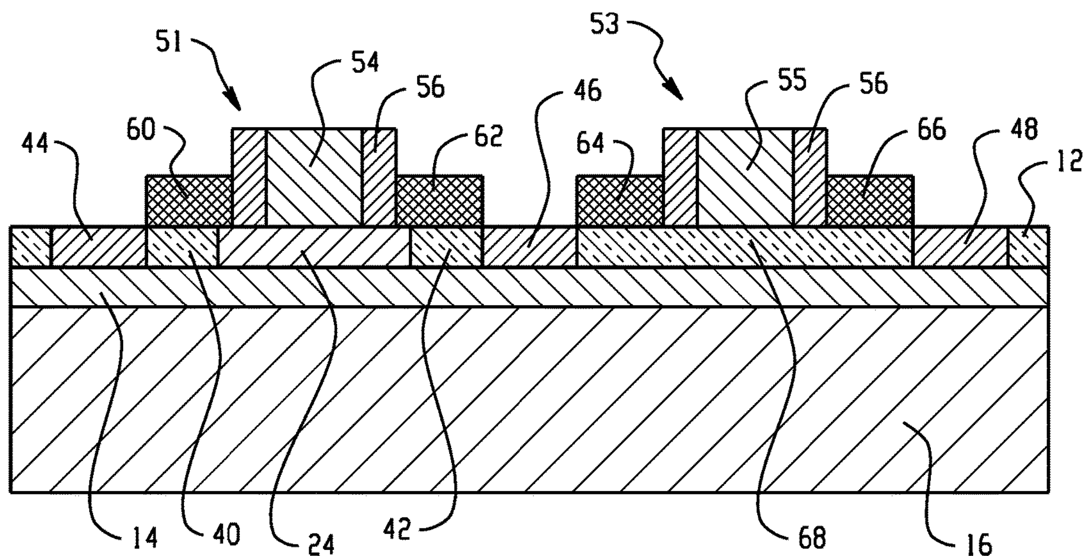
Figure 6:
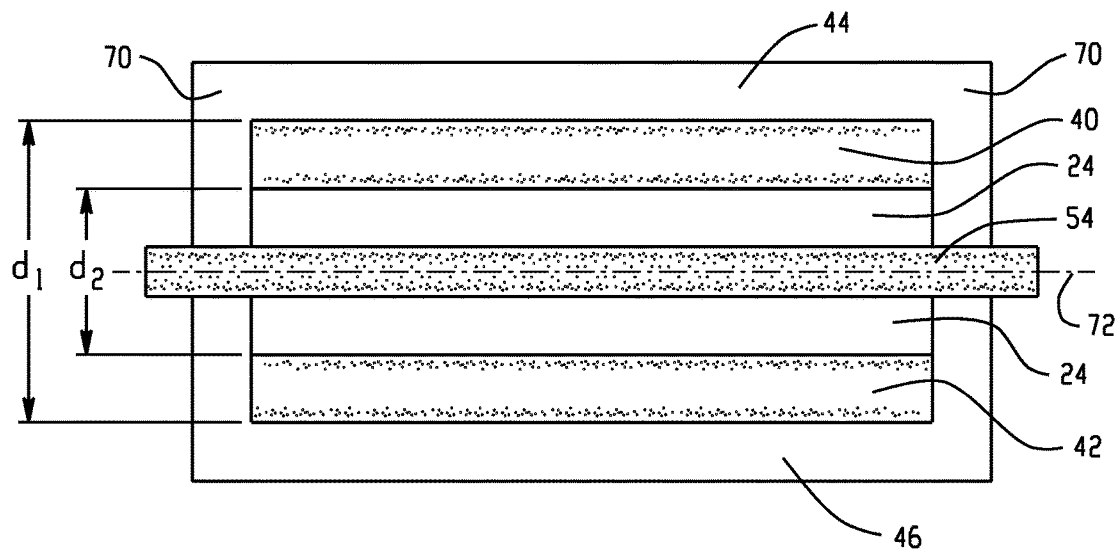
FIG. 6 is a schematic top view in which the gate stack, the processed portion of the device layer, the trench isolation regions, and the portions of the device layer providing strain retention in the processed portion are shown for clarity of description.

With reference to FIGS. 5 and 6 in which like reference numerals refer to like features in FIG. 4 and at a subsequent fabrication stage, field-effect transistors 51, 53 may be fabricated using the respective device regions 50, 52 (FIG. 4) by complementary metal oxide semiconductor (CMOS) processes during front end of line (FEOL) processing. The field-effect transistors 51, 53 respectively include gate structures 54, 55 consisting of a gate dielectric and a gate electrode. The gate electrode may be comprised of a metal, a silicide, polycrystalline silicon (polysilicon), or combinations of these materials, deposited by physical vapor deposition (PVD), chemical vapor deposition, etc. The gate dielectric may be comprised of a dielectric or insulating material, such as silicon dioxide, silicon oxynitride, a high-k dielectric material such as hafnium oxide or hafnium oxynitride, or layered combinations of these dielectric materials, deposited by chemical vapor deposition, atomic layer deposition (ALD), etc. The gate dielectric and gate electrode may be formed by patterning a layer stack of their constituent materials using photolithography and etching processes. Non-conductive spacers 56 may be formed on the sidewalls of the gate structures 54, 55.

Field-effect transistor 51 includes raised source/drain regions 60, 62 flanking its gate structure 54, and field-effect transistor 53 likewise includes raised source/drain regions 64, 66 flanking its gate structure 54. An epitaxial growth process may be used to deposit a semiconductor material, such as silicon, silicon germanium (SiGe), or carbon-doped silicon, to form the raised source/drain regions 60, 62, 64, 66, and may include in situ doping during deposition to impart conductivity types. The source/drain regions 60, 62, 64, 66 may have a popped shape, as shown, or may alternatively have a pinned shape. The gate structures 54, 55 may function to self-align the epitaxial semiconductor material of the raised source/drain regions 60, 62, 64, 66. The semiconductor material of the raised source/drain regions 60, 62 may comprise a p-type dopant selected from Group III of the Periodic Table (e.g., boron (B)) that is effective to impart p-type conductivity. The semiconductor material of the raised source/drain regions 64, 66 may comprise an n-type dopant from Group V of the Periodic Table (e.g., phosphorus (P) or arsenic (As)) that is effective to impart n-type conductivity. As used herein, the term "source/drain region" means a doped region of semiconductor material that can function as either a source or a drain of the field-effect transistors 51, 53.

The channel 68 of field-effect transistor 53, which is located between its raised source/drain regions 64, 66 and beneath its gate structure 54, is comprised of semiconductor material from the device layer 12. The channel of field-effect transistor 51, which is located between its raised source/drain regions 60, 62 and beneath its gate structure 54, is comprised of the semiconductor material of the processed portion 24 of device layer 12.

The gate structure 54, when biased with a given voltage, applies an electric field to the channel to switch the field-effect transistor 51 between an "ON" state in which its channel becomes conductive and an "OFF" state. In the "ON" state, charge carriers flow in the channel from the one of the source/drain regions 60, 62 serving as a source for field-effect transistor 51 to the other of the source/drain regions 60, 62 serving as the drain of the field-effect transistor 51. In the "OFF" state, the channel may be considered to be fully depleted because there are substantially no charge carriers over the entire height of the channel portion of the field-effect transistor 51, which may be particularly observed if the device layer 12 is extremely thin in thickness. Similar considerations apply for field-effect transistor 53.

The germanium-enriched composition of the processed portion 24 of device layer 12 comprising the channel of the field-effect transistor 51 may operate to improve the performance of the field-effect transistor 51, which may be characterized as a p-type field-effect transistor. In particular, the germanium-enhanced composition of the processed portion 24 of device layer 12 enhances hole carrier mobility during operation. Because the processed portion 24 of device layer 12 extends over the full thickness of the device layer 12 from the bottom surface of the gate structure 64 to the top surface of the BOX layer 14, the entirety of a fully-depleted channel may incorporate the strain that enhances carrier mobility.

The locations of the isolation regions 44, 46 and the trenches 28, 30 containing the isolation regions 44, 46 are selected and implemented initially by the openings in the etch mask 26 such that the formation of the isolation regions 44, 46 does not intersect the processed portion 24 of device layer 12. As a consequence, the strain incorporated into the processed portion 24 of device layer 12 defining the channel of field-effect transistor 51 and in a direction transverse to the longitudinal axis 72 of the gate structure 64 is not relaxed, which means that the enhancement to the hole carrier mobility is not reduced by the formation of the isolation regions 44, 46. The portions 40, 42 of the device layer 12, which separate the processed portion 24 of device layer 12 from the isolation regions 44, 46 and the trenches 28, 30 in which the isolation regions 44, 46 reside, promote retention of the compressive strain incorporated into the processed portion 24 of device layer 12 at the time of its formation by the thermal process (e.g., condensation).

The retained compressive strain in the channel of field-effect transistor 51 is directed across the channel length of the field-effect transistor 51, which is transverse to the longitudinal axis 72 (i.e., a line extending through the center of the gate structure 64) of the gate structure 64. In the width dimension that is parallel to the longitudinal axis of the gate structure 64, isolation regions 70 are contiguous with and abut (i.e., touch or contact) the processed portion 24 of device layer 12. The trenches used to form these isolation regions 70 penetrate through the processed portion 24 of device layer 12. As a result, the component of the compressive strain directed parallel to the long axis of the gate structure 64 is relaxed so that the processed portion 24 of device layer 12 is uniaxially strained in a direction transverse to this longitudinal axis and is not biaxially strained.

In an alternative embodiment in which the field-effect transistor 51 is an n-type field-effect transistor, the processed portion 24 of device layer 12 may be placed under tensile stress that increases electron carrier mobility in the channel of an n-type field-effect transistor. To that end, the composition of the epitaxial semiconductor layer 22 may be selected to provide a processed portion 24 (a channel) that is tensile-strained after thermal processing. For example, the epitaxial semiconductor layer 22 may be composed of silicon doped with carbon (Si:C) and a smaller atom, such as carbon (C), than silicon may be transferred from the epitaxial semiconductor layer 22 into the processed portion 24 of device layer 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a device layer of a silicon-on-insulator substrate, the device structure comprising:

a gate structure on the device layer;

a channel in the device layer, the channel located beneath the gate structure, and the channel comprised of a semiconductor material under a strain; and a first isolation region in the device layer, wherein a first portion of the device layer is located between the first isolation region and the channel, the channel extends over a full thickness of the device layer from the gate structure to a buried oxide layer of the silicon-on-insulator substrate, and the first portion of the device layer is under a strain that is less than the strain in the semiconductor material of the channel.

2. The device structure of claim 1 wherein the first portion of the device layer is juxtaposed with the channel, and the first portion of the device layer is juxtaposed with the first isolation region.

3. The device structure of claim 1 further comprising:

a second isolation region in the device layer; and a second portion of the device layer located between the second isolation region and the channel, wherein the second portion of the device layer is under a strain that is less than the strain in the semiconductor material of the channel.

4. The device structure of claim 1 wherein the first portion of the device layer is composed of a semiconductor material, the semiconductor material of the channel and the semiconductor material of the first portion of the device layer have different compositions, the silicon-on-insulator substrate further includes the buried oxide layer, and the semiconductor material of the channel extends from a top surface of the device layer to the buried oxide layer.

5. The device structure of claim 4 wherein the device layer has a thickness ranging from 2 nm to 15 nm.

6. The device structure of claim 4 wherein the semiconductor material of the channel is comprised of silicon-germanium, and the semiconductor material of the first portion of the device layer is comprised of silicon.

7. The device structure of claim 1 wherein the gate structure has a length transverse to a longitudinal axis of the gate structure, and the strain in the semiconductor material of the channel is directed in the channel parallel to the length.

8. The device structure of claim 7 wherein the channel has a width parallel to the longitudinal axis of the gate structure, and further comprising:

a second isolation region in the device layer, the second isolation region arranged to contact the channel in a direction of the width.

9. The device structure of claim 1 further comprising:

a source coupled with the channel; and a drain coupled with the channel, wherein the strain in the semiconductor material of the channel is directed between the source and the drain.

10. The device structure of claim 1 wherein the first portion of the device layer is unstrained, and the strain in the semiconductor material of the channel is compressive strain.

11. A method of forming a device structure using a device layer of a silicon-on-insulator substrate, the method comprising:

forming a channel in the device layer;

forming a first isolation region in the device layer such that a first portion of the device layer between the first isolation region and the channel; and forming a gate structure on the device layer;

wherein the channel is located beneath the gate structure and is comprised of a semiconductor material under a first strain, the channel extends over a full thickness of the device layer from the gate structure to a buried oxide layer of the silicon-on-insulator substrate, and the first portion of the device layer is under a strain that is less than the first strain in the semiconductor material of the channel.

12. The method of claim 11 wherein forming the channel in the device layer comprises:

forming a hardmask with an opening extending to the device layer;

depositing an epitaxial semiconductor layer on the device layer inside the opening; and transporting atoms of an element from the epitaxial semiconductor layer into the device layer, wherein the epitaxial semiconductor layer and the device layer have different compositions.

13. The method of claim 12 wherein the composition of the epitaxial semiconductor layer comprises silicon germanium, and transporting the atoms of the element from the epitaxial semiconductor layer into the portion of the device layer comprises:

performing a thermal process to transport germanium atoms from the epitaxial semiconductor layer into the device layer.

14. The method of claim 13 wherein the thermal process is thermal condensation in which the silicon germanium of the epitaxial semiconductor layer is converted into an oxide of silicon by thermal oxidation as the germanium is transported from the epitaxial semiconductor layer into the device layer.

15. The method of claim 11 further comprising:

forming a second isolation region in the device layer such that a second portion of the device layer is located between the second isolation region and the channel, wherein the second portion of the device layer is under a strain that is less than the first strain in the semiconductor material of the channel.

16. The method of claim 11 wherein the portion of the device layer is composed of a semiconductor material, the semiconductor material of the channel has a different composition than the semiconductor material of the portion of the device layer, the silicon-on-insulator substrate further includes the buried oxide layer, and the semiconductor material of the channel extends from a top surface of the device layer to the buried oxide layer.

17. The method of claim 11 wherein the gate structure has a length transverse to a longitudinal axis of the gate structure, and the first strain in the semiconductor material of the channel is directed in the channel parallel to the length.

18. The method of claim 17 wherein the channel has a width parallel to the longitudinal axis of the gate structure, and further comprising:

forming a second isolation region in the device layer, wherein the second isolation region is arranged to contact the channel in a direction of the width.

19. The method of claim 11 further comprising:

forming a source coupled with the channel; and forming a drain coupled with the channel, wherein the first strain in the semiconductor material of the channel is directed between the source and the drain.

20. The method of claim 11 wherein the first portion of the device layer is unstrained, and the first strain in the semiconductor material of the channel is compressive strain.

* * * * *

UNITED STATES PATENT AND TRADEMARK OFFICE

CERTIFICATE OF CORRECTION

PATENT NO. : 9,871,057 B2
APPLICATION NO. : 15/060067
DATED : January 16, 2018
INVENTOR(S) : Karen A. Nummy et al.

It is certified that error appears in the above-identified patent and that said Letters Patent is hereby corrected as shown below:

In the Claims

Column 8, Claim 1, Line 29, after "a" insert --first-- and at Line 36, after "a" insert --second-- and at Line 37, before "strain", insert --first--

Column 8, Claim 3, Line 47, change "strain that is less than the strain" to --third strain that is less than the first strain--

Column 8, Claim 4, Line 53, after "compositions,", delete "the silicon-on-insulator substrate further includes a buried oxide layer,"

Column 8, Claim 7, Line 65, before "strain", insert --first--

Column 9, Claim 9, Line 10, before "strain", insert --first--

Column 9, Claim 10, Line 13, before "strain", insert --first--

Column 9, Claim 11, Line 28, before "strain", insert --second--

Column 10, Claim 15, Line 15, before "strain", insert --third--

Column 10, Claim 16, Lines 22-23, delete "the silicon-on-insulator substrate further includes the buried oxide layer,"

Signed and Sealed this
Nineteenth Day of June, 2018

Andrei Iancu
*Director of the United States Patent and Trademark Office*